United States Patent
Shimomura et al.

(10) Patent No.: US 7,633,795 B2
(45) Date of Patent: Dec. 15, 2009

(54) MAGNETORESISTIVE RANDOM ACCESS MEMORY AND ITS WRITE CONTROL METHOD

(75) Inventors: Naoharu Shimomura, Sagamihara (JP); Tatsuya Kishi, Yokohama (JP); Ryousuke Takizawa, Naka-Gun (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/533,622

(22) Filed: Sep. 20, 2006

(65) Prior Publication Data

US 2007/0159875 A1 Jul. 12, 2007

(30) Foreign Application Priority Data

Jan. 12, 2006 (JP) .............................. 2006-005202

(51) Int. Cl.
*G11C 11/00* (2006.01)
(52) U.S. Cl. ........................... 365/158; 365/46; 365/48; 365/55; 365/145; 365/147
(58) Field of Classification Search ................ 365/158, 365/46, 48, 55, 145, 147
See application file for complete search history.

(56) References Cited

U.S. PATENT DOCUMENTS

| 5,841,611 | A  | * | 11/1998 | Sakakima et al. | ............ 360/324 |
| 6,178,112 | B1 | * | 1/2001  | Bessho et al.   | ................ 365/173 |
| 6,256,222 | B1 | * | 7/2001  | Sakakima et al. | ............ 365/158 |
| 6,256,224 | B1 | * | 7/2001  | Perner et al.   | ................ 365/173 |
| 6,297,987 | B1 | * | 10/2001 | Johnson et al.  | ............. 365/158 |
| 6,418,046 | B1 | * | 7/2002  | Naji            | ........................... 365/158 |
| 6,980,469 | B2 | * | 12/2005 | Kent et al.     | ................... 365/171 |
| 7,286,395 | B2 | * | 10/2007 | Chen et al.     | ................... 365/158 |
| 2002/0145905 | A1 | * | 10/2002 | Hirai       | ........................... 365/158 |
| 2003/0123283 | A1 | * | 7/2003  | Amano et al.| ................ 365/173 |
| 2003/0185045 | A1 | * | 10/2003 | Drewes      | ....................... 365/158 |
| 2004/0027853 | A1 | * | 2/2004  | Huai et al. | ................... 365/158 |

FOREIGN PATENT DOCUMENTS

| JP | 2002-358775 | 12/2002 |
| JP | 2003-151260 | 5/2003 |
| JP | 2003-331574 | 11/2003 |
| JP | 2005-50424  | 2/2005 |

OTHER PUBLICATIONS

U.S. Appl. No. 11/829,408, filed Jul. 27, 2007, Kitagawa, et al.

* cited by examiner

*Primary Examiner*—Amir Zarabian
*Assistant Examiner*—Fernando N Hidalgo
(74) *Attorney, Agent, or Firm*—Oblon, Spivak, McClelland, Maier & Neustadt, L.L.P.

(57) ABSTRACT

A write control method for a magnetoresistive random access memory, which includes a memory cell having a recording layer with an axis of easy magnetization and an axis of hard magnetization. The write control method includes writing a datum into the memory cell. The writing of the datum includes applying a pulsative first magnetic field substantially parallel to the axis of easy magnetization of the recording layer and a pulsative second magnetic field substantially parallel to the axis of hard magnetization to the recording layer so as to cause a period of the pulsative first magnetic field and a period of the pulsative second magnetic field to overlap each other, and applying a pulsative third magnetic field having substantially the same direction as the pulsative first magnetic field to the recording layer at least once after applying the pulsative first magnetic field to the recording layer.

12 Claims, 10 Drawing Sheets

MAGNETORESISTIVE RANDOM ACCESS MEMORY AND ITS WRITE CONTROL METHOD

CROSS-REFERENCE TO RELATED APPLICATION

This application is based upon and claims the benefit of priority from prior Japanese Patent Application Nos. 2006-5202 filed on Jan. 12, 2006 in Japan, the entire contents of which are incorporated herein by reference.

BACKGROUND OF THE INVENTION

1. Field of the Invention

The present invention relates to a magnetoresistive random access memory and its write control method.

2. Related Art

The magnetoresistive random access memory (hereafter referred to as MRAM as well) is a memory device using a magnetic element using a magnetoresistive effect in a cell part which stores information. The magnetoresistive random access memory is drawing attention as a memory device of next generation having features of fast operation, a large capacity and non-volatility. The magnetoresistive effect is a phenomenon that the electric resistance changes according to the direction of magnetization in a ferromagnetic substance when a magnetic field is applied to the ferromagnetic substance. The ferromagnetic substance can be made to operate as a memory device by using the direction of magnetization in the ferromagnetic substance to record information and reading out information according to whether the electric resistance corresponding to the direction is large. In recent years, a magnetoresistive change rate (MR ratio) of 200% or more is obtained at room temperatures owing to the tunnel magnetoresistive effect (TMR effect) in a ferromagnetic tunnel junction including a sandwich structure having an insulation layer (a tunnel barrier layer) interposed between two ferromagnetic layers. Taking that opportunity, a MRAM using a magnetoresistive effect element (hereafter referred to as TMR element as well) having a magnetic tunnel junction (hereafter referred to as MTJ as well) is drawing expectation and attention.

When a TMR element is used as a magnetic element in a cell part of an MRAM, a magnetization pinned layer having a pinned magnetization direction is used as a reference layer which is one of two ferromagnetic layers having a tunnel barrier layer interposed between, and a magnetization free layer having a magnetization direction which can be inverted is used as a recording layer which is the other of the two ferromagnetic layers. Magnetization of the reference layer is pinned in one direction, and it is not inverted in a magnetic field of approximately 100 Oe. For example, in order to pin the magnetization direction in the reference layer, a method of providing an anti-ferromagnetic layer so as to be in contact with the reference layer and making magnetization inversion hard to occur by exchange coupling force is used. On the other hand, the recording layer is formed of a soft magnetic material, and it is inverted by a weak magnetic field in the order of 10 Oe. The tunnel barrier layer is formed of a very thin film having a thickness in the order of 1 nm.

If a voltage of approximately 0.5 V is applied from the recording layer toward the reference layer, then tunnel current flows. Its resistance value becomes low, when the recording layer is parallel in magnetization direction to the reference layer. A resistance value at this time is supposed to be $R_0$. On the other hand, when the recording layer is anti-parallel in magnetization direction to the reference layer, the resistance value becomes high. A resistance value at this time is supposed to be $R_1$. A function as a memory is provided by using a resistance value between the high resistance state and the low resistance state. The ratio of $R_0$ to $R_1$ is called MR ratio (Magnet Resistance Ratio), and it is found from the relation $MR=(R_1-R_0)/R_0$. Although the value of the MR ratio differs depending upon the material included in the TMR element, it assumes a value in the range of several 10% to approximately 200%. A margin RM for readout is found from the value of the MR ratio and standard deviations $\delta_{R0}$ and $\delta_{R1}$ respectively of $R_0$ and $R_1$ according to the relation $RM=MR/(\delta_{R0}+\delta_{R1})$. As the MR ratio becomes larger and as resistance variations $\delta_{R0}$ and $\delta_{R1}$ become smaller, the readout margin RM becomes large.

In an MRAM having such TMR elements as storage elements of memory cells, bit lines and word lines are arranged across a TMR element from each other so as to nearly cross each other at right angles. The TMR element is provided in a crossing region of these writing wiring pieces. An induced magnetic field is generated by letting currents flow through these writing wiring pieces. Since two writing wiring pieces cross each other at right angles, induced magnetic fields generated when current are let flow cross each other. Writing is conducted by inverting the magnetization of the recording layer in the TMR element by the use of a current magnetic field generated from the two wiring pieces. For example, arrangement is conducted so as to typically cause a magnetic field generated by a current flowing through a bit line to be directed in a long side direction of the TMR element, i.e., in an axis of easy magnetization. As a result, the direction of magnetization in the recording layer after writing is determined. It is supposed that the magnetization after writing in the recording layer becomes anti-parallel, i.e., it is brought into the high resistance state (state of "1") when a current is let flow through the bit line in a certain direction. If a current is let flow through the bit line in the opposite direction, the magnetization after writing in the recording layer becomes parallel, i.e., it is brought into the low resistance state (state of "0"). The magnetic field induced by a current flowing through the word line assists the inversion, but it does not determine the value written in.

In this way, the MRAM is set so as not to cause inversion when a current is let flow through either the bit line or the word line and so as to cause inversion only when a current is let flow through each of the bit line and the word line (see, for example, JP-A 2003-331574 (KOKAI)). As a result, two-axis selection becomes possible when the TMR elements are arranged in an array form.

Thus, magnetization inversion is conducted by letting currents flow through both the bit line and the word line. A TMR element in which a current is flowing through either the bit line or the word line is in a half-selection state. The current value is selected so as not to cause inversion in the TMR element in the half-selection state.

When a write current is let flow in order to shift the TMR element from the low resistance state to the high resistance state, the resistance value is anticipated to change from $R_0$ to $R_1$. On rare occasions, however, the resistance value becomes a middle value between $R_0$ and $R_1$. The middle value is denoted by $R_2$. If the value of $R_2$ is smaller than a value anticipated from the normal distribution of $R_1$, this bit is brought into an intermediate state which is neither the low resistance state nor the high resistance state, resulting in false writing.

Also when writing is conducted so as to shift from the high resistance state to the low resistance state, the intermediate state is brought about in some cases.

SUMMARY OF THE INVENTION

According to a first aspect of the present invention, there is provided a write control method for a magnetoresistive random access memory including at least one memory cell, the memory cell including a magnetoresistive effect element as a storage element, the magnetoresistive effect element including a recording layer having an axis of easy magnetization and an axis of hard magnetization and of which magnetization direction is changeable, a reference layer of which magnetization direction is pinned, and an insulation layer provided between the recording layer and the reference layer, the write control method including:

applying a pulsative first magnetic field substantially parallel to the axis of easy magnetization of the recording layer and a pulsative second magnetic field substantially parallel to the axis of hard magnetization to the recording layer so as to cause a period of the pulsative first magnetic field and a period of the pulsative second magnetic field to overlap each other; and applying a pulsative third magnetic field having substantially the same direction as the pulsative first magnetic field to the recording layer at least once after applying the pulsative first magnetic field to the recording layer.

According to a second aspect of the present invention, there is provided a write control method for a magnetoresistive random access memory including at least one memory cell, the memory cell including a magnetoresistive effect element as a storage element, the magnetoresistive effect element including a recording layer having an axis of easy magnetization and an axis of hard magnetization and of which magnetization direction is changeable, a reference layer of which magnetization direction is pinned, and an insulation layer provided between the recording layer and the reference layer, the write control method comprising:

applying a pulsative first magnetic field substantially parallel to the axis of easy magnetization of the recording layer and a pulsative second magnetic field substantially parallel to the axis of hard magnetization to the recording layer so as to cause a period of the pulsative first magnetic field and a period of the pulsative second magnetic field to overlap each other;

reducing a magnitude H1 of the pulsative first magnetic field to be a magnitude H2 which is zero or more and which is less than the magnitude H1; and applying a pulsative third magnetic field having substantially the same direction as the pulsative first magnetic field and having a magnitude H3 to the recording layer at least once, a sum of the magnitude H3 and the magnitude H2 being equal to or less than the magnitude H1.

According to a third aspect of the present invention, there is provided a write control method for a magnetoresistive random access memory including at least one memory cell, the memory cell including a magnetoresistive effect element as a storage element, the magnetoresistive effect element including a recording layer of which magnetization direction is changeable, a reference layer of which magnetization direction is pinned, and an insulation layer provided between the recording layer and the reference layer, the write control method comprising:

injecting a spin-polarized pulse current into the recording layer a plurality of times, when conducting writing by injecting a spin-polarized pulse current into the recording layer.

According to a fourth aspect of the present invention, there is provided a magnetoresistive random access memory comprising:

a first wiring;
a second wiring;
a memory cell including a magnetoresistive effect element as a storage element, the magnetoresistive effect element being provided so as to be associated with an intersection region of the first wiring and the second wiring, the magnetoresistive effect element including a recording layer having an axis of easy magnetization and an axis of hard magnetization and of which magnetization direction is changeable, a reference layer of which magnetization direction is pinned, and an insulation layer provided between the recording layer and the reference layer;

a first current generation circuit which generates a first pulse current and causes the first pulse current to flow through the first wiring in order to generate a first magnetic field substantially parallel to a direction of the axis of easy magnetization of the recording layer to be applied to the recording layer; and a second current generation circuit which generates a second pulse current and causes the second pulse current to flow through the second wiring in order to generate a second magnetic field substantially parallel to a direction of the axis of hard magnetization of the recording layer to be applied to the recording layer, wherein the first and second current generation circuits generate the first and second pulse currents so as to cause periods of the first magnetic field and the second magnetic field to overlap each other, and after generation of the first pulse current, the first current generation circuit generates a third pulse current at least once so as to cause a third magnetic field having substantially the same direction as a direction of the first magnetic field, the third magnetic field being applied to the recording layer.

According to a fifth aspect of the present invention, there is provided a magnetoresistive random access memory comprising:

a first wiring;
a second wiring;
a memory cell including a magnetoresistive effect element as a storage element, the magnetoresistive effect element including a recording layer of which magnetization direction is changeable, a reference layer of which magnetization direction is pinned, and an insulation layer provided between the recording layer and the reference layer, one end of the magnetoresistive effect element being electrically connected to the first wiring, the other end of the magnetoresistive effect element being electrically connected to the second wiring;

a first current generation circuit which generates a first pulse current a plurality of times and causes a spin-polarized pulse current to flow through the magnetoresistive effect element via the first wiring a plurality of times, when writing a first value into the memory cell; and a second current generation circuit which generates a second pulse current a plurality of times and causes a spin-polarized pulse current to flow through the magnetoresistive effect element via the second wiring a plurality of times, when writing a second value into the memory cell.

DETAILED DESCRIPTION OF THE INVENTION

Hereafter, embodiments of the present invention will be described with reference to the drawings.

First Embodiment

A write control method for a magnetoresistive random access memory (MRAM) according to a first embodiment of the present invention will now be described with reference to FIGS. 1 to 7.

Figure 2A:
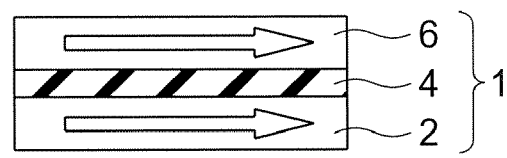
FIGS. 2A and 2B are sectional views showing a schematic configuration of a TMR element used in embodiments of the present invention.
Figure 2B:
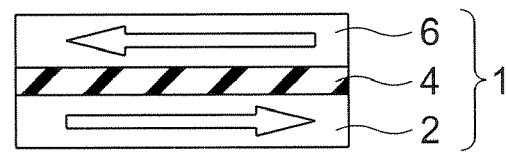

An MRAM using a write control method according to the present embodiment includes a plurality of memory cells arranged in an array form. Each memory cell includes a magnetoresistive effect element (TMR element) having a ferromagnetic tunnel junction as a storage element. As shown in FIGS. 2A and 2B, a TMR element 1 includes a reference layer 2 of which the magnetization direction is pinned, a recording layer 6 of which the magnetization direction is changeable, and a tunnel barrier layer 4 provided between the reference layer 2 and the recording layer 6. If the recording layer 6 is parallel in magnetization direction to (is the same in direction as) the reference layer 2 (see FIG. 2A), the TMR element 1 becomes low in resistance. If the recording layer 6 is anti-parallel in magnetization direction to (is opposite in direction to) the reference layer 2 (see FIG. 2B), the TMR element 1 becomes high in resistance.

Figure 3:
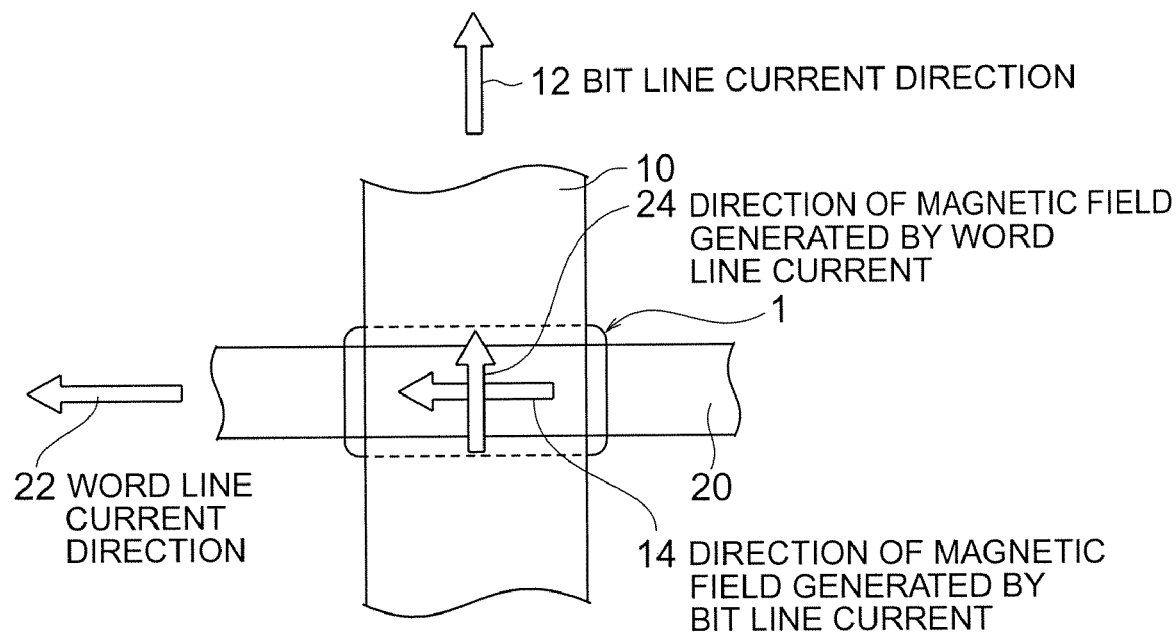
FIG. 3 is a top view of a memory cell in an MRAM used in embodiments of the present invention.
Figure 4:
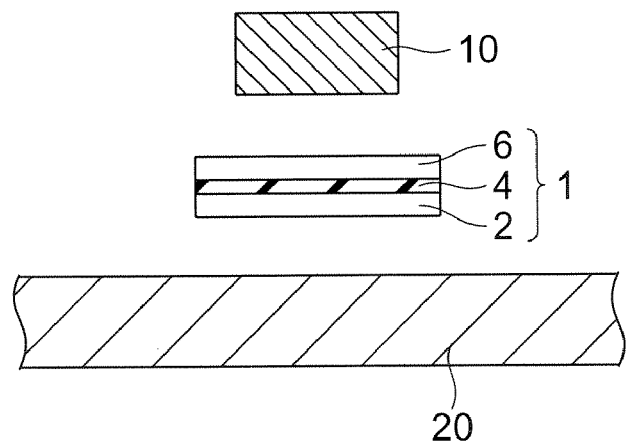
FIG. 4 is a sectional view of a memory cell in an MRAM used in embodiments of the present invention.

As shown in FIGS. 3 and 4, the TMR 1 in each memory cell is provided in association with an intersection region of a bit line 10 and a word line 20 disposed so as to cross the bit line 10 at right angles. FIG. 3 is a top view of each memory cell. FIG. 4 is a sectional view of each memory cell. The bit line 10 is disposed in parallel to a short side direction of the TMR element 1 (a direction of axis of hard magnetization of the recording layer 6). If a current is let flow through the bit line 10 in a direction of an arrow 12, therefore, a current magnetic field acts on the TMR element 1 in a direction of an arrow 14, i.e., in a direction of axis of easy magnetization of the recording layer 6. If a current is let flow through the word line 20 in a direction of an arrow 22, a current magnetic field acts on the TMR element 1 in a direction of an arrow 24, i.e., in the direction of axis of hard magnetization of the recording layer 6. By the way, if the bit line 10 is disposed in parallel to the axis of easy magnetization of the recording layer 6 and the word line 20 is disposed so as to cross the axis of easy magnetization of the recording layer 6 at right angles, interpretation may be conducted by replacing the bit line and the word line with each other in the ensuing description.

Figure 1:
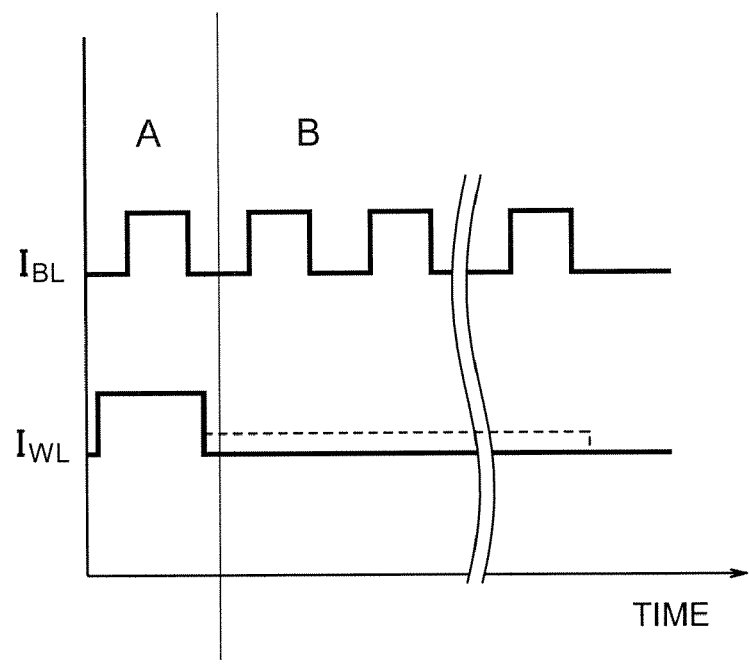
FIG. 1 is a diagram showing current pulse waveforms used in a write control method according to a first embodiment of the present invention.

A write control method according to the present embodiment will now be described with reference to FIG. 1. FIG. 1 is a waveform diagram showing currents let flow through the bit line and the word line when writing data in the present embodiment. The case where the initial state of the TMR element 1 to be subjected to writing is in the low resistance state (a state in which the reference layer 2 is parallel in magnetization direction to the recording layer 6) and magnetization is inverted by writing resulting in a high resistance state will now be described.

Figure 5:
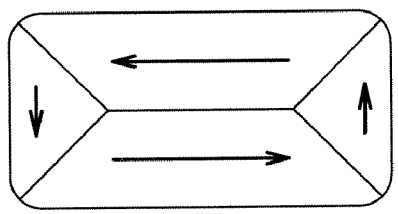
FIG. 5 is a diagram showing a magnetic domain structure of a recording layer when a TMR element is in an intermediate state.
Figure 6:
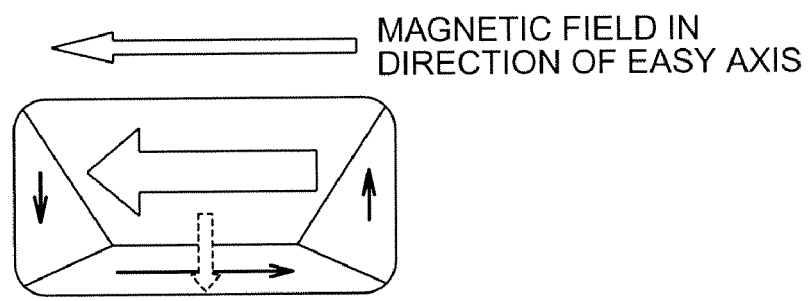
FIG. 6 is a diagram for explaining movement of a magnetic domain wall in a recording layer obtained when a magnetic field generated by a current pulse is made to act in a direction of axis of easy magnetization.

When writing data in the TMR element 1, a current pulse $I_{WL}$ is first let flow through the word line 20 as shown in FIG. 1. When the current $I_{WL}$ is in the "H" state (ON state), a current pulse $I_{BL}$ is let flow through the bit line 10. The current pulse $I_{BL}$ is formed so as to rise to assume an "H" state when the current pulse $I_{WL}$ is in the "H" state and then falls to assume an "L" state (see a region A in FIG. 1). By the way, a write pulse width is in the range of approximately 0.1 to 100 ns. Writing in the conventional art is conducted by only the pulse in the region A shown in FIG. 1. In this case, the resistance of the TMR element 1 assumes the intermediate state in some cases as described earlier. Magnetization in the recording layer 6 of the TMR element 1 which is in the intermediate state has a multi magnetic domain structure as shown in FIG. 5. A closure domain structure including four domains is shown in FIG. 5, and a magnetic domain wall is formed between magnetic domains. It is considered that upper and lower magnetic domains occupying wide areas (magnetization anti-parallel to the reference layer 6 and magnetization parallel to the reference layer 6) are respectively in high resistance and low resistance state, and the TMR element as a whole assumes a middle resistance value.

In the present embodiment, however, current pulses $I_{BL}$ are added only to the bit line 10 after the current pulse $I_{WL}$ and the current pulse $I_{BL}$ are raised (see a region B in FIG. 1). The direction of the current let flow through the bit line 10 by current pulses applied in the addition is made the same as that of the current let flow through the bit line 10 in the region A shown in FIG. 1. The additional current pulse is let flow through the bit line 10 at least once. In the present embodiment, the current pulse $I_{WL}$ flowing through the word line 20 is completely let fall to become zero in current value. Alternatively, the current value may be half or less of the current let flow (see a broken line shown in FIG. 1).

In this way, the current pulse $I_{WL}$ flowing through the word line 20 is completely let fall or a current value is made equal to half or less of the current let flow, and then an additional current pulse is applied to the bit line 10. Even if the TMR element 1 should be brought into an intermediate state by the write pulse in the region shown in FIG. 1, a magnetic field generated by additional current pulses causes the TMR element 1 to slip out of the intermediate state and brings it into the anticipated high resistance state. The reason is considered as follows. When additional current pulses are applied to the bit line 10, a magnetic filed acts in the direction of axis of easy magnetization of the recording layer 6. As a result, the magnetic domain wall moves in a direction indicated by a broken line arrow in FIG. 6 at a rising edge of a current pulse. Accordingly, a magnetic domain indicated by a thick arrow is widened. In addition, the movement of the magnetic domain wall advances, and the magnetic domain wall is swept out of the TMR element 1. The magnetic domain spreads to the whole of the TMR element, and the magnetization has only one direction. As a result, the intermediate state is eliminated and a normal magnetic domain structure is brought about. The reason described heretofore is considered. By the way, the additional pulse magnetic field is applied once or at least twice. Furthermore, instead of completely letting the current pulse $I_{WL}$ flowing through the word line 20 fall to become zero in current value, the current value may be made half or less of the current let flow before applying the above-described additional current pulses.

In order to prevent false writing in which another TMR element on the same bit line is inverted by the additional current pulses, the intensity of the magnetic field generated by the additional current pulses is made equivalent or less than the intensity of the magnetic field generated by the first current pulse. The additional pulses may be equal to or shorter than the first pulse in width.

When shifting a high resistance state, which is the initial state, to a low resistance state by using a write current, a current pulse inverted in polarity from the above-described case is applied to the bit line 10 and a current pulse having the same polarity is applied to the word line 20. In this case as well, it is possible to prevent the occurrence of the intermediate state by conducting writing in accordance with the sequence shown in FIG. 1. In the portion of the region A shown in FIG. 1, the word line is raised earlier and the bit line is let fall earlier in the present embodiment. However, as for combinations of rising and falling sequences on the word line and the bit line, there are nine possible combinations inclusive of earlier, later and simultaneously. Even if any combination is selected out of these combinations, the effect of reducing the probability that the intermediate state will occur is obtained by applying the additional pulses shown in the region B in FIG. 1.

Figure 7:
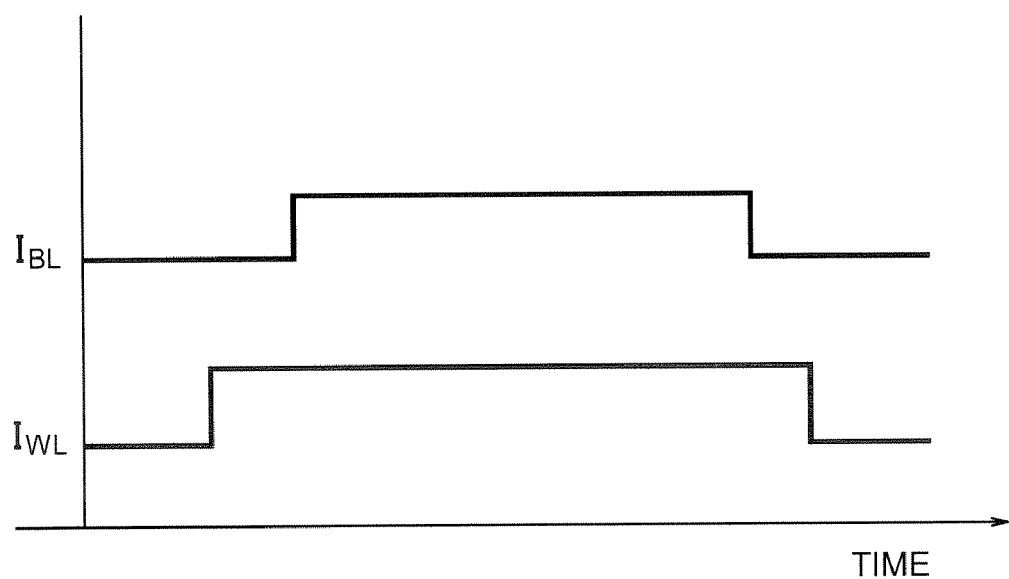
FIG. 7 is a waveform diagram showing write pulses used in a write control method of a comparative example of a first embodiment.

The number of times of applying the additional pulse is determined by using a method described hereafter. First, for example, the reference layer and the recording layer of the TMR element are formed of a material that is apt to cause the intermediate state. This TMR element is subject to a write test using conventional write pulses shown in FIG. 7 and a write test using the write pulses in the present embodiment shown in FIG. 1. In the write test using the write pulses shown in FIG. 1, the test is conducted while changing the number of times of applying the additional pulse. An attenuation factor of the intermediate state is found as a function of the number of additional pulses by comparing the occurrence frequencies of the intermediate state found from these write tests. By the way, pulse widths of the write pulses shown in FIG. 7 are made equal to pulse widths of the write pulses in the region A shown in FIG. 1.

Subsequently, write tests are conducted on condition that the TMR element is actually used as an MRAM, and the frequency of readout errors caused by the intermediate state is found. The number of times of applying the additional pulses is determined so as to make a value obtained by multiplying the frequency of the readout error by the attenuation factor found earlier small to satisfy specifications of the MRAM as the memory. This method can be applied not only to the present embodiment, but also to the case of the write pulses used in the second to fourth embodiments described hereafter.

Effects of the write control method according to the present embodiment will now be described with reference to FIGS. 8 and 9.

Figure 8:
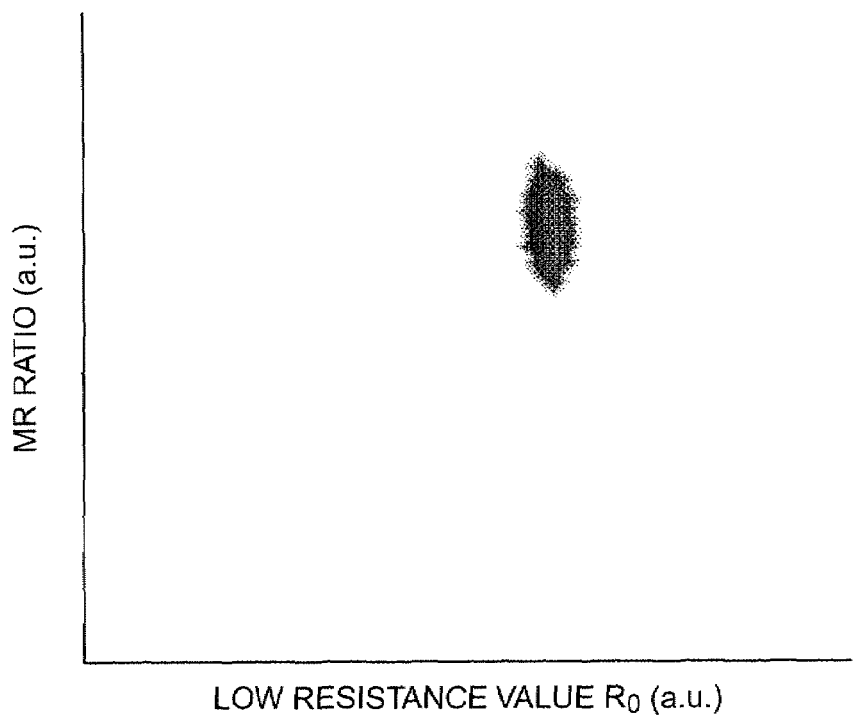
FIG. 8 is a diagram showing a relation between a low resistance value R0 of an MRAM and an MR ratio obtained when a write control method in the first embodiment is used for each bit of the MRAM.

FIG. 8 shows results of experiments for examining effects of the write control method according to the present embodiment. TMR elements corresponding to 1 kbits arranged in an array form is subjected to writing so as to assume the low resistance state bit by bit, and a resistance value $R_0$ of the TMR elements is measured. The TMR ratio is found by using the relation $MR=(R_1-R_0)/R_0$. A graph shown in FIG. 8 indicates distribution of $R_0$ and the MR ratio with respect to 1 kbits. The frequency of occurrence of the intermediate state is very low when the typical material and shape of the TMR elements are used. In the experiments, however, a material and a shape of the TMR elements which especially makes the occurrence probability of the intermediate state high are selected to facilitate confirmation of the effects of the present embodiment.

Figure 9:
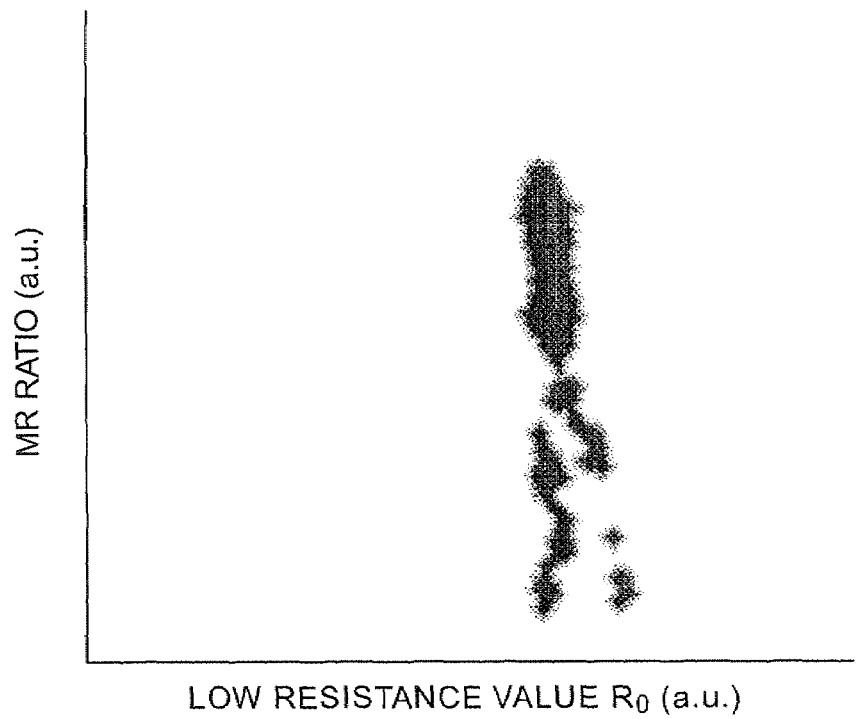
FIG. 9 is a diagram showing a relation between a low resistance value R0 of an MRAM and an MR ratio obtained when a write control method in a comparative example is used for each bit of the MRAM.

FIG. 9 is a graph showing experiment results of $R_0$ and the MR ratio obtained as a comparative example when writing is conducted by letting a pulse current through each of the word line and the bit line once by using the write pulses shown in FIG. 7. By the way, the graphs shown in FIG. 8 show experiment results obtained when an additional pulse is applied to the bit line 100 times.

In the results of the comparative example shown in FIG. 9, the values of $R_0$ and the MR ratio are distributed widely. It is necessary that distributions $\delta R_0$ and $\delta_{R1}$ of resistance values are sufficiently small as compared with the product $MR \cdot R_0$ of MR and $R_0$ to allow a readout margin. In the comparative example shown in FIG. 9, however, there are a large number of bits each having an intermediate value between originally anticipated resistance values $R_0$ and $R_1$. Therefore, the resistance distribution becomes very large, and a readout margin cannot be obtained.

On the other hand, in the case of the present embodiment shown in FIG. 8, the distribution of the values $R_0$ and the MR ratio is small, and it is more advantageous in readout as compared with the case of the comparative example shown in FIG. 9. In FIG. 9, bits having a value of MR ratio smaller than a value of MR ratio shown in FIG. 8 are bits assuming the intermediate state. Since the present embodiment shown in FIG. 8 differs from the comparative example shown in FIG. 9 in the additional bit line pulses applied after the bit line and word line write pulses, it is indicated that the additional bit line pulses eliminate the intermediate state and restore the originally anticipated state. It is important in eliminating the intermediate state not to lengthen the write time but to input a plurality of pulse currents. Even if the current input time is lengthened to the order of millisecond under the condition that one pulse is used, the distribution of $R_0$ and the MR ratio becomes the same as the case shown in FIG. 9 and the intermediate state cannot be eliminated. On the other hand, even if the additional pulse is applied only once, effects are obtained. If the additional pulse is applied approximately ten times, the intermediate state is nearly eliminated.

The experiments are conducted especially under the condition that the probability of occurrence of the intermediate state is high. In the actual operation of the MRAM, there is a possibility that the intermediate state will occur with a certain probability. However, it becomes possible to reduce the probability of occurrence of the intermediate state to a level that poses no problem in the operation of the MRAM by using the write control method according to the present embodiment.

According to the present embodiment, it is possible to prevent the recording layer in the TMR element from assuming the intermediate state as perfectly as possible even if writing into the MRAM is conducted, as heretofore described

Second Embodiment

A write control method for magnetoresistive random access memory according to a second embodiment of the present invention will now be described with reference to FIG. 10. The write control method according to the present embodiment is applied to MRAMs shown in, for example, FIGS. 2A to 4 in the same way as described with reference to the first embodiment. A waveform diagram of write pulses used for the write control method according to the present embodiment is shown in FIG. 10.

Figure 10:
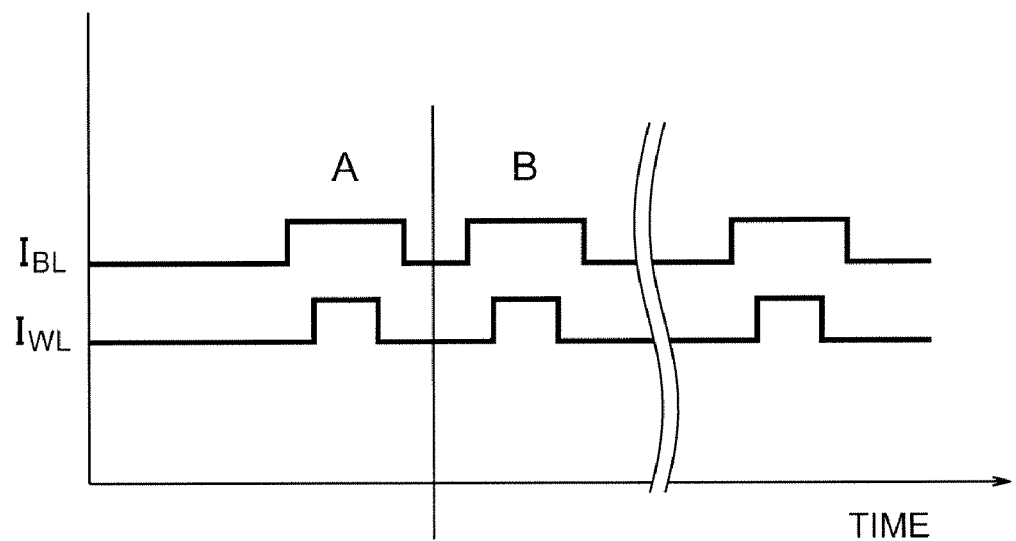
FIG. 10 is a diagram showing current waveforms used in a write control method according to a second embodiment of the present invention.

As shown in FIG. 10, a current $I_{BL}$ is let flow through the bit line 10 and then a current $I_{WL}$ is let flow through the word line 20. As a result, a magnetic field parallel to the axis of easy magnetization generated by the current $I_{BL}$ let flow through the bit line 10 and a magnetic field parallel to the axis of hard magnetization generated by the current $I_{WL}$ let flow through the word line 20 act simultaneously on the TMR element 1 to be subjected to writing.

Thereafter, the current $I_{WL}$ let flow through the word line 20 is let fall and subsequently the current $I_{BL}$ let flow through the bit line 10 is let fall. As a result, current magnetic fields of both write wiring pieces are let fall. Thereafter, pulse currents are applied to the bit line 10 and the word line 20 again to let magnetic fields act on the TMR element 1. In other words, in the present embodiment, a current pulse is applied to each of the bit line and the word line a plurality of times to conduct writing. Owing to this write sequence, the intermediate state can be eliminated. The effect appears if the number of times of applying the current pulse is at least twice. As the number of times increases, a greater effect can be obtained. If the number of times is approximately ten, the intermediate state is eliminated nearly completely. The number of times of applying the current pulse is set equal to an optimum value on the basis of the trade-off between the probability of occurrence of the intermediate state and the write time. In order to avoid false writing caused by inverting another TMR element on the same bit line, the height of the current pulse in the second time and subsequent times is equal to or less than that of the current pulse in the first time.

In the present embodiment as well, it is possible to prevent the recording layer in the TMR element from assuming the intermediate state as perfectly as possible even if writing into the MRAM is conducted, in the same way as the first embodiment.

Third Embodiment

A write control method for magnetoresistive random access memory according to a third embodiment of the present invention will now be described with reference to FIG. 11. The write control method according to the present embodiment is applied to MRAMs shown in, for example, FIGS. 2A to 4 in the same way as described with reference to the first embodiment. A waveform diagram of write pulses used for the write control method according to the present embodiment is shown in FIG. 11.

Figure 11:
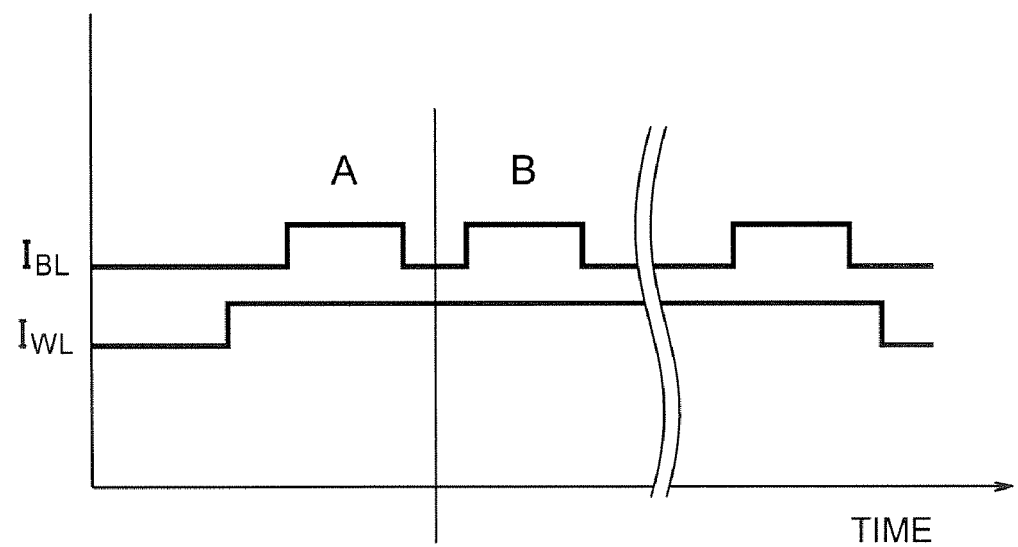
FIG. 11 is a diagram showing current pulse waveforms used in a write control method according to a third embodiment of the present invention.

As shown in FIG. 11, a current $I_{WL}$ is first let flow through the word line 20 and then a current $I_{BL}$ is let flow through the bit line 10. As a result, a magnetic field parallel to the axis of easy magnetization generated by the current $I_{BL}$ let flow through the bit line 10 and a magnetic field parallel to the axis of hard magnetization generated by the current $I_{WL}$ let flow through the word line 20 act simultaneously on the TMR element 1 to be subjected to writing. Thereafter, while keeping the current $I_{WL}$ flowing through the word line 20, only the current $I_{BL}$ flowing through the bit line 10 is let fall to let the current magnetic field of the bit line fall. Thereafter, while keeping the current $I_{WL}$ flowing through the word line 20, a pulse current is applied to the bit line 10 at least once to let a magnetic field act. In other words, in the present embodiment, while keeping the current pulse for writing applied to the word line 20, a current pulse is applied to the bit line 10 a plurality of times repetitively. By thus applying a current pulse to the bit line 10 a plurality of times, the probability of occurrence of the intermediate state can be reduced. The height of the pulse on the bit line 10 in the second time and subsequent times is equal to or less than that of the pulse in the first time.

In the present embodiment as well, it is possible to prevent the recording layer in the TMR element from assuming the intermediate state as perfectly as possible even if writing into the MRAM is conducted, in the same way as the first embodiment.

Fourth Embodiment

Figure 12:
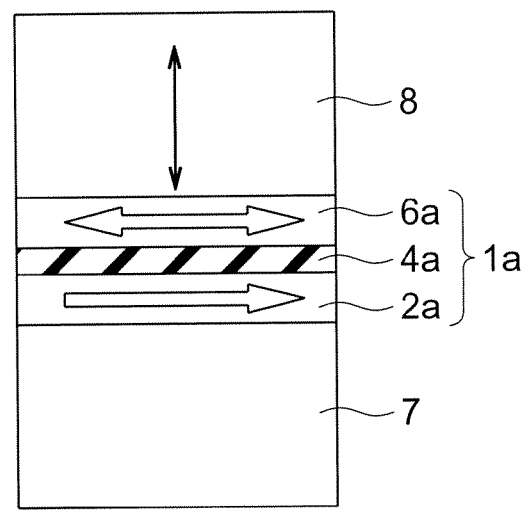
FIG. 12 is a sectional view showing a configuration of a TMR element of an MRAM in which a write control method according to a fourth embodiment of the present invention is used.

A write control method for magnetoresistive random access memory (MRAM) according to a fourth embodiment of the present invention will now be described with reference to FIGS. 12 and 13. An MRAM using the write control method according to the present embodiment includes a plurality of memory cells arranged in an array form. Each memory cell has a TMR element as a storage element. Writing is conducted by injecting a spin-polarized current into the recording layer (conducting spin injection). As shown in FIG. 12, a TMR element 1a in each memory cell includes a reference layer 2a having a pinned magnetization direction, a recording layer 6a having a variable magnetization direction, and a tunnel barrier layer 4a provided between the reference layer 2a and the recording layer 6a. The TMR element 1a is connected at one end thereof to write wiring 7 and electrically connected at the other end thereof to write wiring 8.

In such a TMR element 1a, magnetization of the recording layer 6a and the reference layer 2a is not always parallel to a face of the recording layer 6a, and the magnetization is in a slant or a vertical direction in some cases. In writing using the spin injection, magnetization of the recording layer 6a is inverted by the use of a spin torque electrons have, by letting a current flow directly through the recording layer 6a in the TMR element 1a. When changing the magnetization direction of the recording layer 6a with respect to the magnetization direction of the reference layer 2a from antiparallel to parallel, a current is let flow so as to let electrons flow from the reference layer 2a side to the recording layer 6a side. When inverting the magnetization from parallel to anti-parallel, electrons are let flow from the recording layer 6a side to the reference layer 2a side. The direction of the current becomes opposite to the direction in which electrons flow. Even if writing is conducted by using the spin injection, the intermediate state is assumed with a certain probability in some cases.

Figure 13:
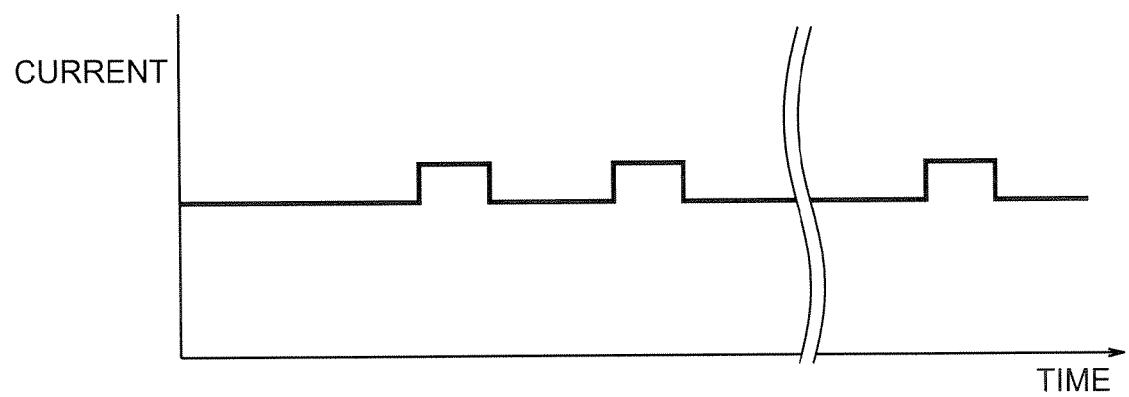
FIG. 13 is a diagram showing a current pulse waveform used in a write control method according to the fourth embodiment.

The write control method according to the present embodiment is conducted by using write pulses shown in FIG. 13. The probability that the TMR element 1a will assume the intermediate state can be lowered by repeating write current pulses injected into the recording layer 6a twice or a greater number of times By the way, it is desirable to make the magnitude of the current pulse in the second time and subsequent times equal to or smaller than that of the current pulse in the first time. The width of the current pulse in the second time and subsequent times may be made equal to or shorter than that of the current pulse in the first time.

In the present embodiment as well, it is possible to prevent the recording layer in the TMR element from assuming the intermediate state as perfectly as possible even if writing into the MRAM is conducted, in the same way as the first embodiment.

Fifth Embodiment

Figure 14:
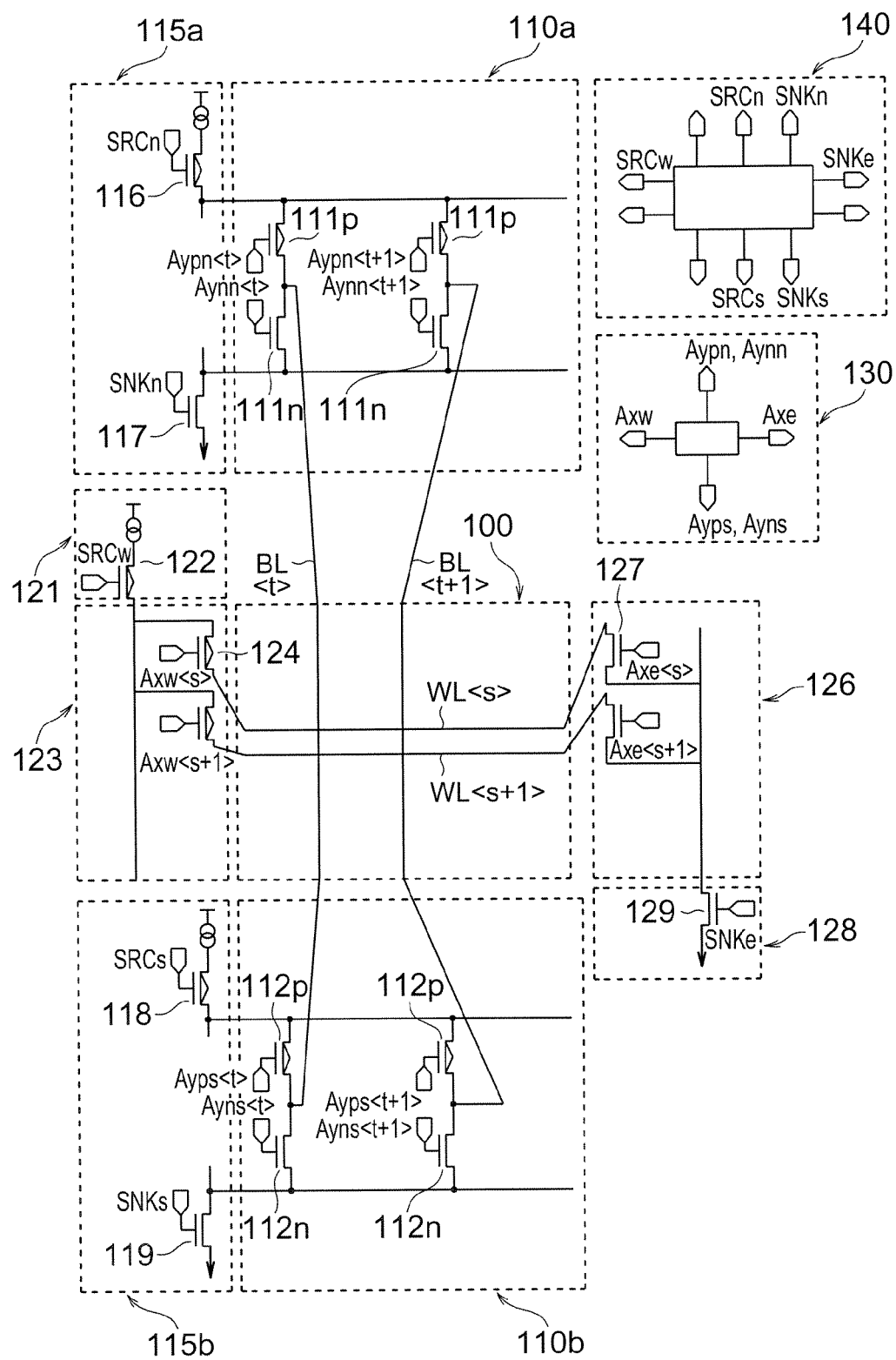
FIG. 14 is a circuit diagram of a magnetoresistive random access memory according to a fifth embodiment of the present invention.

A circuit diagram of a magnetoresistive random access memory (MRAM) according to a fifth embodiment of the present invention is shown in FIG. 14. The MRAM in the present embodiment includes a memory cell array 100, bit line selectors 110a and 110b, bit line current feeders (sinks and sources) 115a and 115b, a word line source 121, word line selectors 123 and 126, a word line sink 128, an address decoder 130, and a source-sink control circuit 140. The memory cell array 100 includes a plurality of bit lines, a plurality of word lines, and TMR elements (not illustrated) provided so as to be associated with intersection regions of bit lines and word lines. By the way, only a tth bit line BL <t>, a (t+1)-th bit line BL <t+1>, an s-th word line WL <s>, and an (s+1)-th word line WL <s+1> are shown in FIG. 14.

In the bit line selector 110a, a p-channel transistor 111p and an n-channel transistor 111n connected in series are provided for each bit line, and one end of an associated bit line is connected to a common-connected node between these transistors. An address control signal Aypn <t> and an address control signal Aynn <t> are applied respectively to gates of the p-channel transistor 111p and the n-channel transistor 111n connected to the tth bit line BL <t>. An end of the transistor 111p different from the common-connected node is connected to a current source via a p-channel transistor 116 in the bit line source-sink 115a. An end of the transistor 111n different from the common-connected node is connected to the ground via an n-channel transistor 117 in the bit line source-sink 115a. Control signals SRCn and SNKn are applied to gates of the transistors 116 and 117, respectively.

In the same way, in the bit line selector 110b, a p-channel transistor 112p and an n-channel transistor 112n connected in series are provided for each bit line, and one end of an associated bit line is connected to a common-connected node between these transistors. An address control signal Ayps <t> and an address control signal Ayns <t> are applied respectively to gates of the p-channel transistor 112p and the n-channel transistor 112n connected to the tth bit line BL <t>. An end of the transistor 112p different from the common-connected node is connected to a current source via a p-channel transistor 118 in the bit line current feeder 115b. An end of the transistor 112n different from the common-connected node is connected to the ground via an n-channel transistor 119 in the bit line current feeder 115b. Control signals SRCs and SNKs are applied to gates of the transistors 118 and 119, respectively.

In the word line selector 123, a p-channel transistor 124 is provided for each word line. One end of the transistor 124 is connected to an associated word line WL <s>. The other end of the transistor 124 is connected to a current source via a p-channel transistor 122 in the word line source 121. An address control signal Axw <s> is applied to the transistor 124 at its gate. A control signal SRCw is applied to the transistor 122 at its gate.

In the same way, in the word line selector 126, a p-channel transistor 127 is provided for each word line. One end of the transistor 127 is connected to the associated word line WL <s>. The other end of the transistor 127 is connected to the ground via a p-channel transistor 129 in the word line sink 128. An address control signal Axe <s> is applied to the transistor 127 at its gate. A control signal SNKe is applied to the transistor 129 at its gate.

The address decoder 130 decodes an address signal input from the outside, outputs address control signals Axe, Axw, Aypn, Aynn, Ayps and Ayns, and send them to the bit line selectors 110a and 110b and the word line selectors 123 and 126. At least one memory cell is selected by the bit line selectors 110a and 110b and the word line selectors 123 and 126 on the basis of the address control signals. The source-sink control circuit 140 outputs control signals SRCn, SNKn, SRCs, SNKs, SRCw and SNKe, and sends them to the bit line source-sinks 115a and 115b, the word line source 121 and the word line sink 128. As a result, write currents flow from one of the bit line source-sinks 115a and 115b and the word line source 121 to a bit line and a word line associated with the selected memory cell, respectively. Writing is thus conducted.

Figure 15:
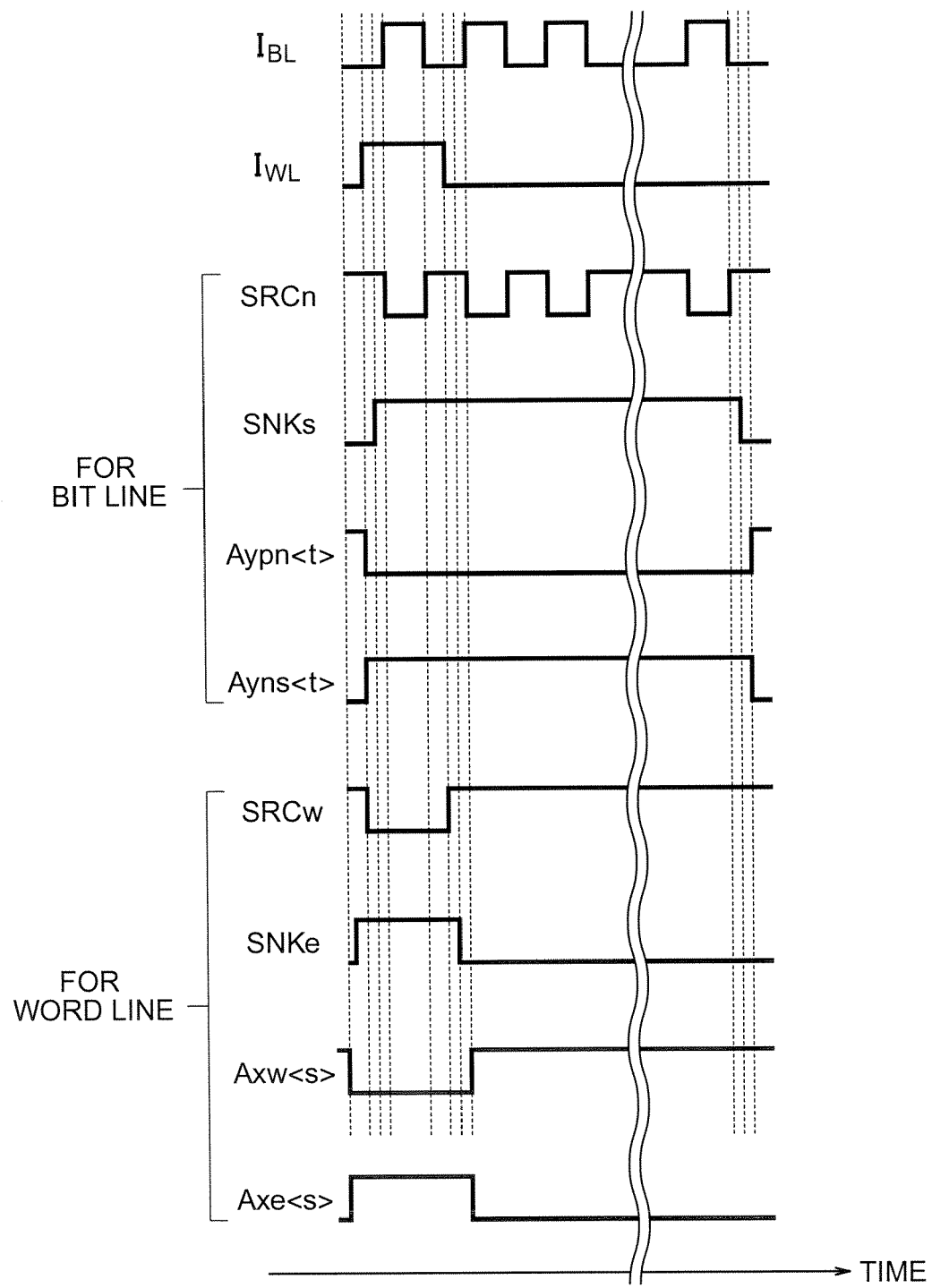
FIG. 15 is a waveform diagram showing the case where data "0" is written in a magnetoresistive random access memory according to the fifth embodiment.
Figure 16:
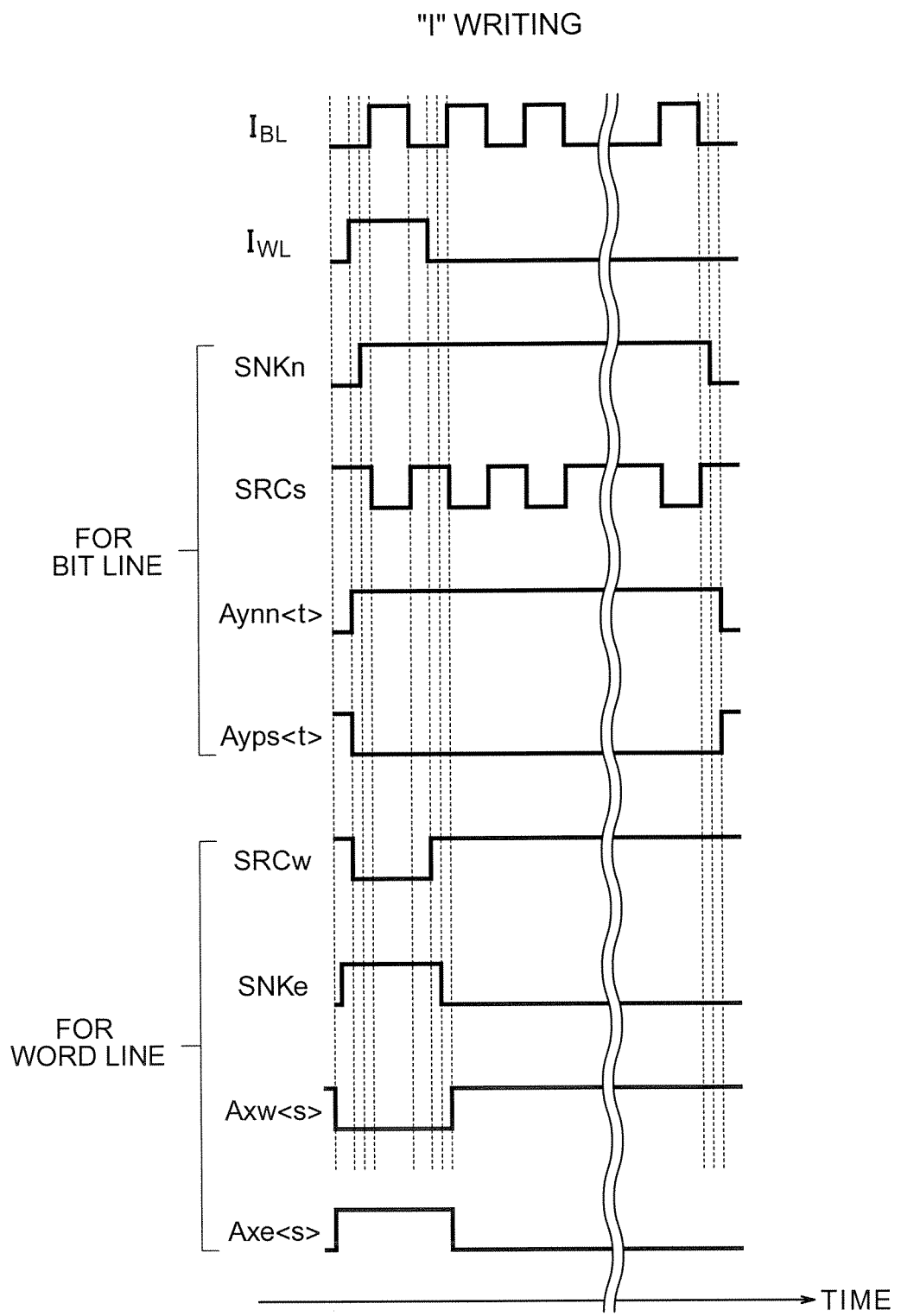
FIG. 16 is a waveform diagram showing the case where data "1" is written in a magnetoresistive random access memory according to the fifth embodiment.

In order to generate the write current pulses shown in FIG. 1 in such an MRAM, the MRAM is operated according to waveform timing charts shown in FIGS. 15 and 16. FIG. 15 is a waveform diagram at the time of data "0" writing. FIG. 16 is a waveform diagram at the time of data "1" writing. The current for the word line is let flow from the left to the right in FIG. 14. The current for the bit line is let flow from the top toward the bottom at the time of data "0" writing, and let flow from the bottom toward the top at the time of data "1" writing. Since the bit line lets a current flow in both directions, the bit line current feeders 115a and 115b each having a source and a sink are disposed in the upper part and the lower part, respectively.

By the way, generation of consecutive pulses is implemented by applying pulses of the control signals SRCn and SRCs to the gates of the transistors 116 and 118 in the bit line current feeders 115a and 115b, respectively. Therefore, address selection is opened earlier than source selection. Furthermore, the initial state is set to Vss by opening the sink earlier than the source. This method is an example of the pulse generation method. There is also a method of applying a pulse to the address selection gate.

Sixth Embodiment

Figure 17:
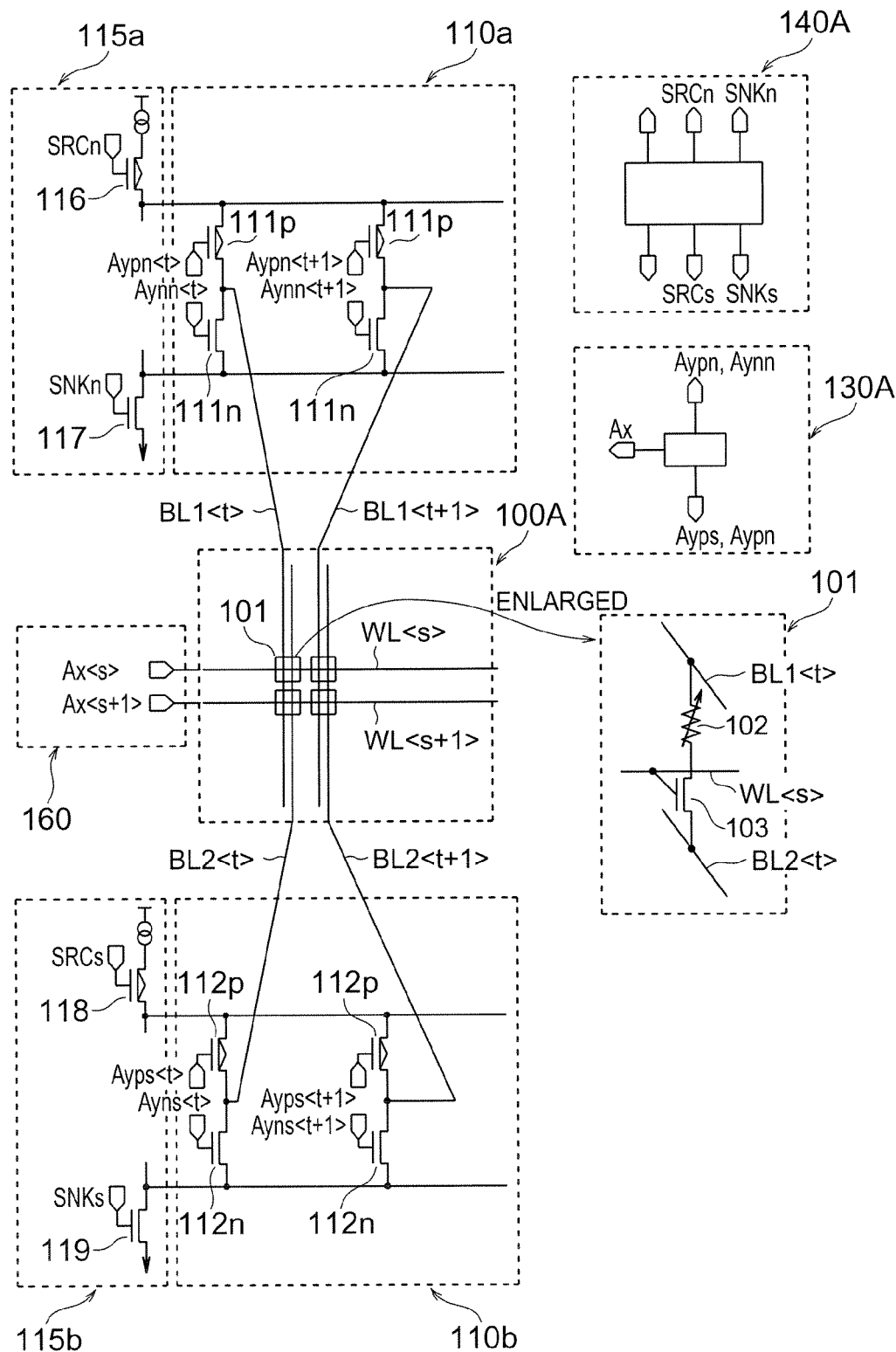
FIG. 17 is a circuit diagram of a magnetoresistive random access memory according to a sixth embodiment of the present invention.

A circuit diagram of a magnetoresistive random access memory (MRAM) according to a sixth embodiment of the present invention is shown in FIG. 17. In the MRAM according to the present embodiment, writing using spin injection is conducted. The MRAM in the present embodiment includes a memory cell array 100A, bit line selectors 110a and 110b, bit line current feeders (sinks and sources) 115a and 115b, a word line selector 160, an address decoder 130A, and a source-sink control circuit 140A. The memory cell array 100A includes a plurality of bit lines, a plurality of word lines, and memory cells 101 provided so as to be associated with intersection regions of bit lines and word lines. By the way, only t-th first bit line BL1 <t> and second bit line BL2 <t>, (t+1)-th first bit line BL1 <t+1> and second bit line BL2 <t+1>, an s-th word line WL <s>, and an (s+1)-th word line WL <s+1> are shown in FIG. 17. Each memory cell 101 includes a TMR element 102 and a selection transistor 103. One end of the TMR element 102 is connected to an associated first bit line BL1 <t>, and the other end of the TMR element 102 is connected to one end of the selection transistor 103. An associated second bit line BL2 <t> is connected to the other end of the selection transistor 103. An associated word line WL <s> is connected to the selection transistor 103 at its gate.

In the bit line selector 110a, a p-channel transistor 111p and an n-channel transistor 111n connected in series are provided for each bit line, and one end of an associated bit line is connected to a common-connected node between these transistors. An address control signal Aypn <t> and an address control signal Aynn <t> are applied respectively to gates of the p-channel transistor 111p and the n-channel transistor 111n connected to the t-th bit line BL <t>. An end of the transistor 111p different from the common-connected node is connected to a current source via a p-channel transistor 116 in the bit line source-sink 115a. An end of the transistor 111n different from the common-connected node is connected to the ground via an n-channel transistor 117 in the bit line current feeder 115a. Control signals SRCn and SNKn are applied to gates of the transistors 116 and 117, respectively.

In the same way, in the bit line selector 110b, a p-channel transistor 112p and an n-channel transistor 112n connected in series are provided for each bit line, and one end of an associated bit line is connected to a common-connected node between these transistors. An address control signal Ayps <t> and an address control signal Ayns <t> are applied respectively to gates of the p-channel transistor 112p and the n-channel transistor 112n connected to the t-th bit line BL <t>. An end of the transistor 112p different from the common-connected node is connected to a current source via a p-channel transistor 118 in the bit line current feeder 115b. An end of the transistor 112n different from the common-connected node is connected to the ground via an n-channel transistor 119 in the bit line current feeder 115b. Control signals SRCs and SNKs are applied to gates of the transistors 118 and 119, respectively.

In the word line selector 160, an address control signal Ax <s> is applied to the word line WL <s>.

The address decoder 130A decodes an address signal input from the outside, outputs address control signals Ax, Aypn, Aynn, Ayps and Ayns, and send them to the bit line selectors 110a and 110b and the word line selector 160. At least one memory cell is selected by the bit line selectors 110a and 110b and the word line selector 160 on the basis of the address control signals. The source-sink control circuit 140A outputs control signals SRCn, SNKn, SRCs and SNKs, and sends them to the bit line source-sinks 115a and 115b. When letting a spin-polarized current flow through the first bit line BL1 <t> associated with a selected memory cell, a spin-polarized write current flows from the bit line source-sink 115a. When letting a spin-polarized current flow through the second bit line BL2 <t> associated with the selected memory cell, a spin-polarized write current flows from the bit line source-sink 115b. Writing is thus conducted. In both cases, a spin-polarized write current pulse is injected into the selected memory cell a plurality of times as described with reference to the fourth embodiment.

According to the embodiments of the present invention, it is possible to prevent the recording layer in the TMR element from assuming the intermediate state as perfectly as possible even if writing into the MRAM is conducted, as heretofore described.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A write control method for a magnetoresistive random access memory including at least one memory cell, the memory cell including a magnetoresistive effect element as a storage element, the magnetoresistive effect element including a recording layer having an axis of easy magnetization and an axis of hard magnetization and of which magnetization direction is variable, a reference layer of which magnetization direction is invariable, and an insulation layer provided between the recording layer and the reference layer, the write control method comprising:

writing a datum into one memory cell, the writing of the datum including, applying a pulsative first magnetic field of a magnitude H1 substantially parallel to the axis of easy magnetization of the recording layer and a pulsative second magnetic field of a magnitude H4 substantially parallel to the axis of hard magnetization to the recording layer so as to cause a period of the pulsative first magnetic field and a period of the pulsative second magnetic field to overlap each other, reducing the magnitude H1 of the pulsative first magnetic field to be a magnitude H2 which is zero or more and which is less than the magnitude H1, increasing the magnitude H2 of the pulsative first magnetic field to a magnitude H3 which is more than the magnitude H2 but equal to or less than the magnitude H1, reducing the magnitude H4 of the pulsative second magnetic field to be zero, and increasing the magnitude of the pulsative second magnetic field from zero to a magnitude H5 which is equal to the magnitude H4 so as to cause a period of the pulsative second magnetic field of the magnitude H5 and a period of the pulsative first magnetic field of the magnitude H3 to overlap each other.

2. The write control method according to claim 1, wherein while the pulsative first magnetic field of the magnitude H3 is applied, the pulsative second magnetic field is continuously applied to the recording layer.

3. The write control method according to claim 1, further comprising:

reducing the magnitude H4 of the pulsative second magnetic field to be zero, wherein while the pulsative first magnetic field of the magnitude H3 is applied to the recording layer, the magnitude of the pulsative second magnetic field keeps zero.

4. A write control method for a magnetoresistive random access memory including at least one memory cell, the memory cell including a magnetoresistive effect element as a storage element, the magnetoresistive effect element including a recording layer of which magnetization direction is variable, a reference layer of which magnetization direction is invariable, and an insulation layer provided between the recording layer and the reference layer, the write control method comprising:

injecting a spin-polarized pulse current into the recording layer a plurality of times for writing a datum into one memory cell, when conducting writing by injecting a spin-polarized pulse current into the recording layer, wherein the pulses of the current are of a same polarity.

5. A magnetoresistive random access memory comprising:

a first wiring;

a second wiring;

a memory cell including a magnetoresistive effect element as a storage element, the magnetoresistive effect element being provided so as to be associated with an intersection region of the first wiring and the second wiring, the magnetoresistive effect element including a recording layer having an axis of easy magnetization and an axis of hard magnetization and of which magnetization direction is variable, a reference layer of which magnetization direction is invariable, and an insulation layer provided between the recording layer and the reference layer;

a first current generation circuit which generates a first pulse current and causes the first pulse current to flow through the first wiring in order to generate a first magnetic field substantially parallel to a direction of the axis of easy magnetization of the recording layer to be applied to the recording layer; and a second current generation circuit which generates a second pulse current and causes the second pulse current to flow through the second wiring in order to generate a second magnetic field substantially parallel to a direction of the axis of hard magnetization of the recording layer to be applied to the recording layer, wherein in order to write a datum into one memory cell, the first and second current generation circuits generate the first and second pulse currents so as to cause periods of the first magnetic field and the second magnetic field to overlap each other, then the first current generation circuit reduces a magnitude of the first pulse current so as to reduce a magnitude H1 of the first magnetic field to be a magnitude H2 which is zero or more and which is less than the magnitude H1, and increases the magnitude of the first pulse current so as to increase the magnitude H2 of the first magnetic field to a magnitude H3 and the second current generation circuit reduces a magnitude of the second pulse current so as to reduce a magnitude H4 of the second magnetic field to be zero, and increases the magnitude of the second pulse current so as to increase the magnitude of the second magnetic field from zero to a magnitude H5 which is equal to the magnitude H4.

6. The magnetoresistive random access memory according to claim 5, comprising:

an array having a plurality of the memory cells; and a selection circuit which selects at least one memory cell from the plurality of memory cells, wherein the first current generation circuit generates the first pulse current so as to cause the first magnetic field to be applied to the recording layer in the selected memory cell, and the second current generation circuit generates the second pulse current so as to cause the second magnetic field to be applied to the recording layer in the selected memory cell.

7. The magnetoresistive random access memory according to claim 5, wherein the second current generation circuit generates the second pulse current in order to cause the second magnetic field to continue to be applied to the recording layer, when the first magnetic field of the magnitude H3 is applied to the recording layer.

8. The magnetoresistive random access memory according to claim 5, wherein the second current generation circuit causes the magnitude of the second pulse current to be zero, when the first magnetic field of the magnitude H3 is applied to the recording layer.

9. The magnetoresistive random access memory according to claim 5, wherein the magnitude H3 of the first magnetic field is equal to or less than the magnitude H1 of the first magnetic field.

10. A magnetoresistive random access memory, comprising:

a first wiring;

a second wiring;

a memory cell including a magnetoresistive effect element as a storage element, the magnetoresistive effect element including a recording layer of which magnetization direction is variable, a reference layer of which magnetization direction is invariable, and an insulation layer provided between the recording layer and the reference layer, one end of the magnetoresistive effect element being electrically connected to the first wiring, the other end of the magnetoresistive effect element being electrically connected to the second wiring;

a first current generation circuit which generates a first pulse current a plurality of times and causes a spin-polarized pulse current to flow through the magnetoresistive effect element via the first wiring a plurality of times, when writing a first datum into one memory cell, wherein the pulses of the first current are of a same polarity; and a second current generation circuit which generates a second pulse current a plurality of times and causes a spin-polarized pulse current to flow through the magnetoresistive effect element via the second wiring a plurality of times, when writing a second datum different from the first datum into one memory cell, wherein the pulses of the second current are of the same polarity.

11. The magnetoresistive random access memory according to claim 10, comprising:

an array having a plurality of the memory cells; and a selection circuit which selects at least one memory cell from the plurality of memory cells, wherein the first current generation circuit generates the first pulse current for the selected memory cell a plurality of times for writing the first datum into the memory cell, when conducting writing into the selected memory cell, and the second current generation circuit generates the second pulse current for the selected memory cell a plurality of times for writing the second datum into the memory cell, when conducting writing into the selected memory cell.

12. The magnetoresistive random access memory according to claim 10, wherein a selection transistor is provided between the magnetoresistive effect element and one of the first wiring and the second wiring.

* * * * *